United States Patent
Venkatraman et al.

(10) Patent No.: US 6,727,757 B1
(45) Date of Patent: Apr. 27, 2004

(54) BIASING CIRCUIT FOR TRANSCONDUCTORS

(75) Inventors: Srinivasan Venkatraman, Dallas, TX (US); Abhijit Kumar Das, Bangalore (IN)

(73) Assignee: Texas Instruments Incoporated, Dallas, TX (US)

( * ) Notice: Subject to any disclaimer, the term of this patent is extended or adjusted under 35 U.S.C. 154(b) by 0 days.

(21) Appl. No.: 10/335,736

(22) Filed: Jan. 2, 2003

(51) Int. Cl.[7] ................................................. H03F 3/45
(52) U.S. Cl. ........................ 330/259; 330/253; 330/258
(58) Field of Search ................................ 330/259, 253, 330/258

(56) References Cited

U.S. PATENT DOCUMENTS

| | | | | |
|---|---|---|---|---|
| 5,281,924 A | * | 1/1994 | Maloberti et al. | 330/253 |
| 5,696,457 A | * | 12/1997 | Rezzi et al. | 327/65 |
| 5,757,230 A | * | 5/1998 | Mangelsdorf | 330/133 |
| 5,912,582 A | * | 6/1999 | Pisati et al. | 327/551 |
| 6,384,636 B1 | | 5/2002 | Koo | |

* cited by examiner

*Primary Examiner*—Patricia Nguyen
(74) *Attorney, Agent, or Firm*—J. Dennis Moore; W. James Brady, III; Frederick J. Telecky, Jr.

(57) ABSTRACT

A transconductor circuit, including a differential transconductor amplifier circuit. The transconductor circuit includes an input pair of transistors adapted to receive a differential input voltage, as well as a pair of output terminals adapted to provide a differential output current. A second pair of transistors provides current to the input pair of transistors. A floating voltage circuit is adapted to generate a floating voltage corresponding to a common-mode voltage of the differential output nodes and to control the second pair of transistors in response to the floating voltage to stabilize the common-mode voltage of the differential transconductor amplifier circuit.

5 Claims, 2 Drawing Sheets

BIASING CIRCUIT FOR TRANSCONDUCTORS

TECHNICAL FIELD OF THE INVENTION

This invention relates to transconductor circuits, and more particularly relates to improved circuits for biasing transconductor circuits.

BACKGROUND OF THE INVENTION

A transconductor circuit is a voltage controlled current source. The proportionality factor between the input voltage and the output current is referred to as the transconductance. Such circuits have general applicability, and in particular are used in filter circuits, multipliers and oscillators.

In some applications of the transconductor circuit, biasing requirements can be quite stringent. For example, in differential continuous-time filter circuits the common-mode bandwidth may be required to be larger than the signal bandwidth, in order to be practically useable. However, in such an application using another amplifier to set a common-mode reference can cause the circuit to have multiple dominant poles. Therefore, stabilizing such a transconductor circuit is difficult.

The problem is that in such transconductor circuits, common-mode feedback is required to enable correct functioning of the circuit, i.e., to maintain the common-mode voltage substantially at the level of the external reference. However, the signal path for this feedback originates at the output nodes of the transconductor circuit and ends where the loop is closed. Further, -a separate external reference voltage is required to set the direct current (D.C.) reference of the two output nodes, since a purely differential circuit merely defines one node with respect to the other. In order to be able to use, practically, these absolute output voltages, an external reference, e.g., with respect to ground, is required. Thus, combining these two requirements gives rise to the problems in stabilization discussed above.

Therefore, it would be desirable to be able to bias transconductor circuits while meeting strict performance requirements and circuit stability.

SUMMARY OF THE INVENTION

In accordance with the present invention there is provided a transconductor circuit, including a differential transconductor amplifier circuit. The transconductor circuit includes an input pair of transistors adapted to receive a differential input voltage, as well as a pair of output terminals adapted to provide a differential output current. A second pair of transistors provides current to the input pair of transistors. A floating voltage circuit is adapted to generate a floating voltage corresponding to a common-mode voltage of the differential output nodes and to control the second pair of transistors in response to the floating voltage to stabilize the common-mode voltage of the differential transconductor amplifier circuit.

These and other features of the invention will be apparent to those skilled in the art from the following detailed description of the invention, taken together with the accompanying drawings.

DETAILED DESCRIPTION OF THE PREFERRED EMBODIMENT

The numerous innovative teachings of the present invention will be described with particular reference to the presently preferred exemplary embodiments. However, it should be understood that this class of embodiments provides only a few examples of the many advantageous uses and innovative teachings herein. In general, statements made in the specification of the present application do not necessarily delimit the invention, as set forth in different aspects in the various claims appended hereto. Moreover, some statements may apply to some inventive aspects, but not to others.

Figure 1:
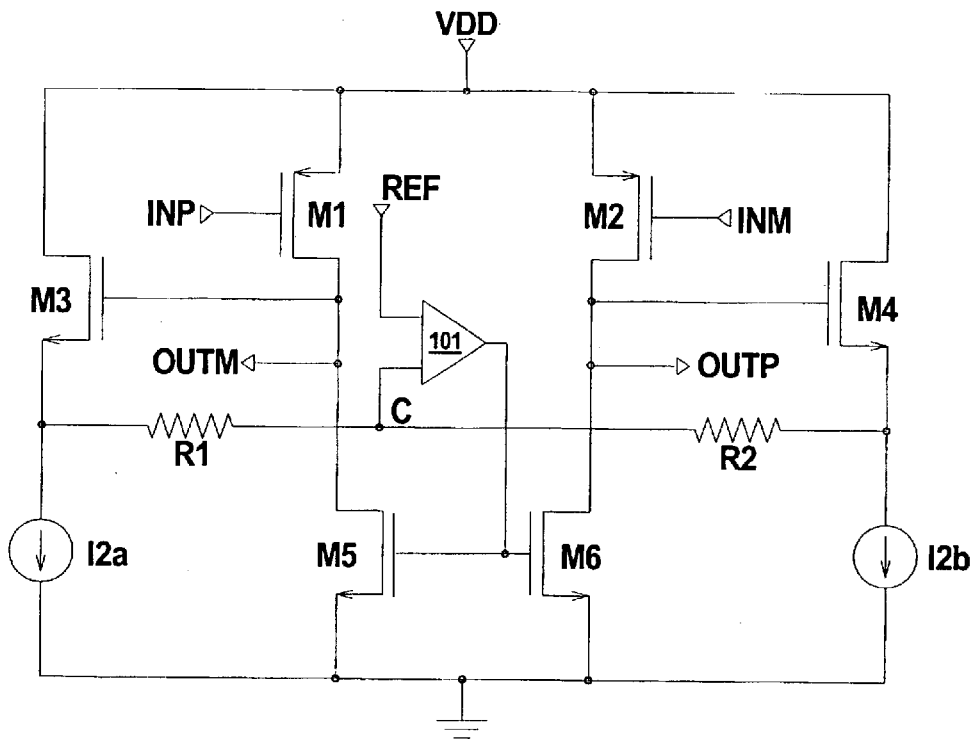
FIG. 1 is a circuit diagram of a prior art transconductor circuit.

FIG. 1 is a circuit diagram of a prior art transconductor circuit, for example as used in a continuous-time filter. The circuit includes PMOS transistors M1 and M2, NMOS transistors M3, M4 and M5, resistors R1 and R2, current sinks 12a and 12b, and voltage amplifier 101. Transistors M1 and M5 are connected in series between a power supply having voltage VDD and ground. Likewise, Transistors M2 and M6 are connected in series between the power supply and ground. Transistor M3 and current sink 12a are connected in series between the power supply and ground. Likewise, transistor M4 and current sink 12b are connected in series between the power supply and ground. The gate of transistor M3 is connected to the drain of transistor M1, while the gate of transistor M4 is connected to the drain of transistor M2. One terminal of resistor R1 is connected to the source of transistor M3, with its other terminal being connected to a node C. One terminal of resistor R2 is connected to the source of transistor M4, with its other terminal being connected to node C. The sizes and magnitudes of components in each half (left and right) of the circuit of FIG. 1 are constructed to be as closely similar as practical, to maintain balance. For example, the resistance value of resistors R1 and R2 is the same, transistors M1 and M2 are the same, etc. One input of voltage amplifier 101 is connected to node C, while its other input is connected to an external reference voltage REF. The output of amplifier 101 is connected to the gates of transistors M5 and M6, which are connected together. The gate terminals of transistors M1 and M2 are shown connected to positive input signal INP and negative input signal INM, respectively. The drain terminals of transistors M1 and M2 are shown connected to positive output signal INP and negative output signal INM, respectively. The output signals OUTP and OUTM drive a load. The circuit of FIG. 1 is exemplary only, and not intended to limit the applicability of the principles of the present invention described below.

In the circuit of FIG. 1 transistors M1 and M2 are the input pair of the transconductor, and perform the voltage to current conversion. Transistors M3 and M4 function as source followers, while resistors R1 and R2 sense the buffered common-mode voltage. Voltage amplifier 101 compares the common-mode voltage generated at node C with external reference voltage REF, and this is fed back though transistors M5 and M6, thus stabilizing the common-mode voltage.

For the circuit of FIG. 1 to be practically useable, the common-mode bandwidth should be larger than the signal bandwidth. However, if the amplifier must have a large bandwidth, the circuit is very difficult to stabilize. In accordance with the present invention the above problem is solved by eliminating the amplifier and using a floating voltage source that can be varied.

Figure 2:
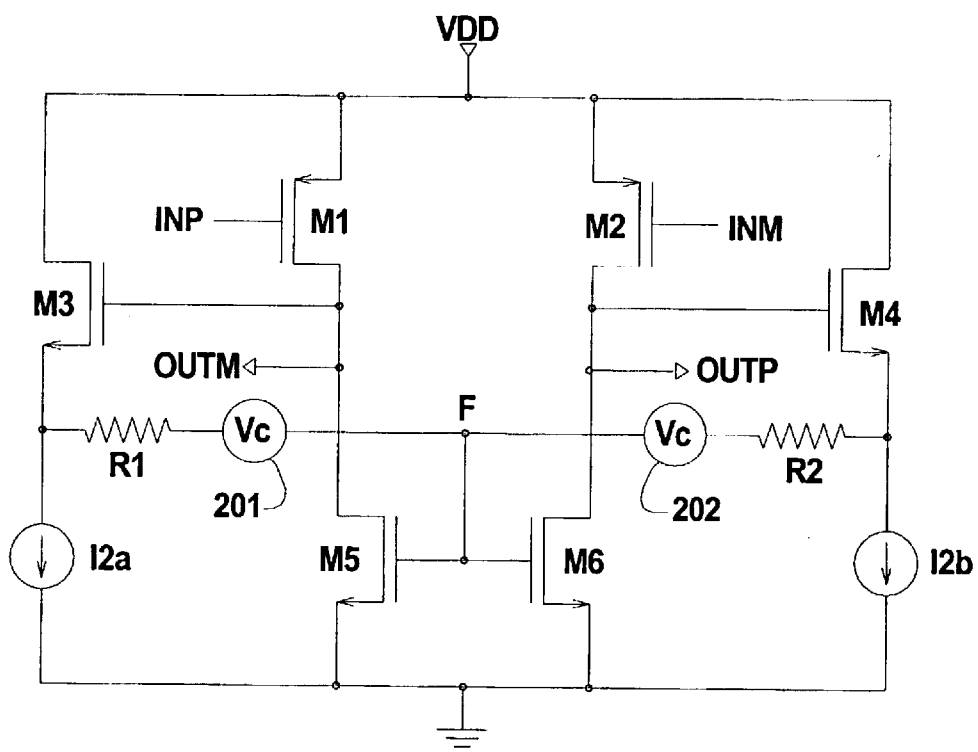
FIG. 2 is a circuit diagram of a transconductor circuit in accordance with a preferred embodiment of the present invention.

FIG. 2 shows an implementation of such solution by way of modification of the circuit of FIG. 1. In the circuit of FIG. 2 components that are the same as those in the circuit of FIG. 1 have the same labels, and their description is not repeated here. As can be seen, amplifier 101 of FIG. 1 including its connection to voltage REF, has been eliminated. Instead, the common-mode voltage is reflected at node F, which is tied directly to the gates of transistors M5 and M6 which, as in FIG. 1, are connected together. A first voltage source 201 having magnitude Vc is connected in series with resistor R1 between node F and the source of transistor M3, while a second voltage source 202 having the same magnitude Vc is connected in series with resistor R2 between node F and the source of transistor M4.

Thus, as can be seen, node F floats. Transistors M3 and M4 still function as source followers, as in FIG. 1, while resistors R1 and R2 still sense the buffered common-mode voltage, as in FIG. 1. However, in the circuit of FIG. 2 the voltage level Vc is selected such that the common mode voltage of outputs OUTP and OUTM is set by the threshold voltage Vt of transistors M3 and M4, the threshold voltage Vt of transistors M5 and M6, and the value of the floating voltage. Note also that transistors M5 and M6 are no longer simply current mirrors. They also function as amplifiers for common-mode feedback.

Figure 3:
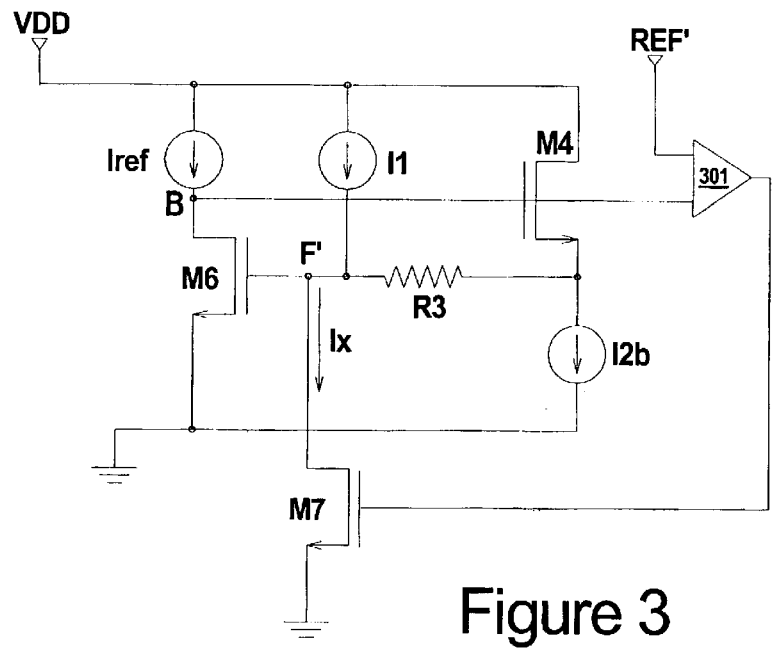
FIG. 3 is a circuit diagram of a first bias circuit in accordance with a still further preferred embodiment of the present invention.

In accordance with a further embodiment of the present invention, a floating voltage source for a transconductor circuit may be generated by driving or drawing current through a resistor R3, as shown in FIG. 3. This figure shows a pertinent portion of one side of a transconductor circuit like that of FIG. 2, specifically feedback transistor M6, source follower transistor M4, and current sink 12b. Resistor R3 is connected between the gate of transistor M6, which is identified as node F', and the source of transistor M4. A current source Iref is connected between the power supply and the drain of transistor M6, which is identified as node B. Current Iref corresponds to the current through transistor M2 in FIG. 2. A current source I1 is connected between the power supply and node F', and an NMOS transistor M7 is connected between node F' and ground. Transistor M7 draws variable current Ix. One input of a voltage amplifier 301 is connected to the drain of transistor M6, while its other input is connected to an external voltage reference REF'. The output of voltage amplifier 301 is connected to the gate of transistor M7.

In this case, a current is used to generate the required floating voltage, i.e., the voltage at node F'. This current, which can be either positive or negative, is generated by driving the fixed current I1 into resistor R3 and drawing a variable current Ix away from R3. Depending upon the value of Ix; the resulting current through resistor R3 can be positive or negative. The circuit operates to force the current though transistor M6 equal to Iref by forcing node B equal to REF' though the feedback loop of voltage amplifier 301 and transistor M7. It will be understood that like circuitry will be present in the other side of the differential transconductor circuit (except that only a single current source 11 is required, since node F' is common to both sides), and that both sets of circuit act in concert to provide such differential function. Thus, the same voltage, i.e., at node B (and its counterpart for the other output node of the circuit), is used to set the direct current (D.C.) reference of the output nodes of the circuit as well as to provide feedback for signals at the output, i.e., through amplifier 301 (and its counterpart for the other output node of the circuit).

Now, the circuit shown in FIG. 3 may be difficult to stabilize over all process and operating variables. This is because of the following. There is a feedback loop from node B through transistor M4, resistor R3 and transistor M6. On top of this loop another loop is superimposed through voltage amplifier 301 and transistor M7, as described above. The gain due to transistor M6 is typically large because of the common-mode requirements. Thus the bias circuit has two dominant poles, one at the gate of transistor M6 and another at its drain. In addition, where programmability is required in the transconductor circuit, Iref can vary over a wide range, adding to the problem.

In accordance with a further embodiment of the present invention, the problems associated with the circuit shown in FIG. 3 are solved in two parts. First, a gate voltage for transistor M6 is provided so as to force its current to be equal to Iref. Second, a current Ix is provided such that the required floating voltage is generated across resistor R3 and the appropriate voltage is available at the gate of transistor M6. By implementing these two parts as separate feedback loops both requirements are met, while circuit stability is not compromised.

Figure 4:
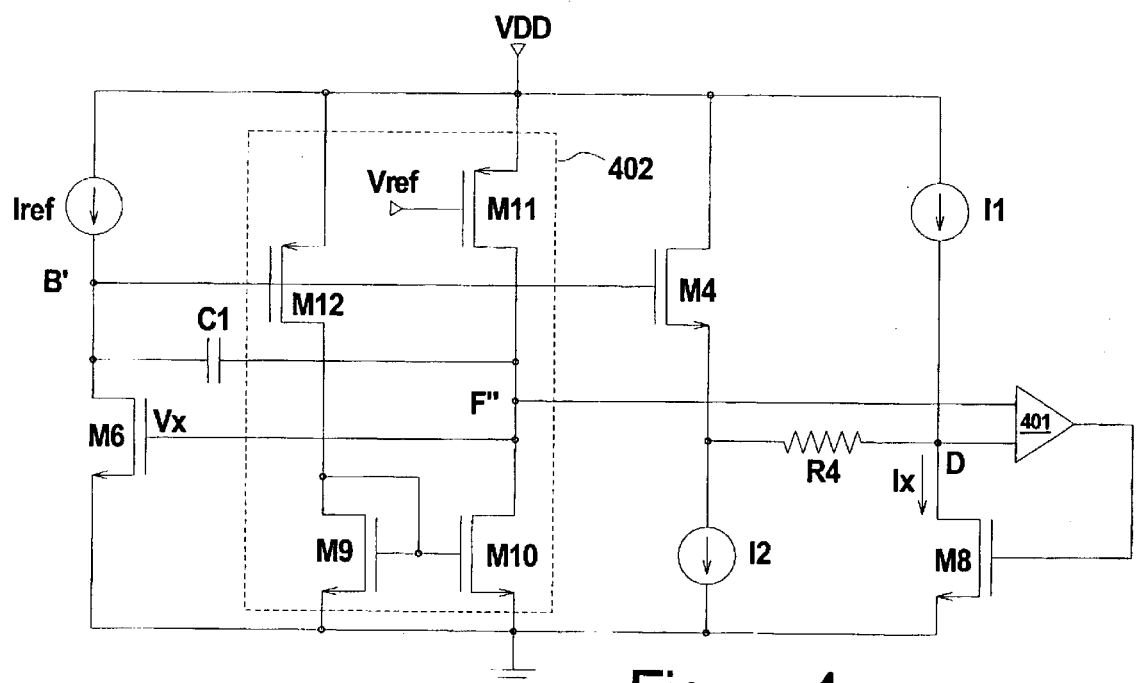
FIG. 4 is a circuit diagram of a second bias circuit in accordance with yet another preferred embodiment of the present invention.

FIG. 4 shows a pertinent portion of one side of a transconductor circuit like that of FIG. 2, specifically feedback transistor M6 and source follower transistor M4. A current source Iref is connected between the power supply and the drain of transistor M6, at a node identified as node B', with the source of transistor M6 being connected to ground, while a current source 11 is connected between the power supply and the drain of an NMOS transistor M8, identified as node D. A current sink 12 is connected between the source of transistor M4 and ground. In addition, a voltage amplifier 401 and a differential amplifier 402 are provided. The differential amplifier 402 is comprised of NMOS transistors M9 and M10, and PMOS transistors M11 and M12, with transistors M9 and M10 being connected as a current mirror. Transistor M12 is connected in series with transistor M9 between the power supply and ground, while transistor M11 is connected in series with transistor M10 between the power supply and ground, with the common connection node of transistors M10 and M11 comprising a floating common-mode voltage node F". The gate of transistor M11 is connected to receive an external reference voltage Vref. The gate of transistor M12 is connected to node B' and to the gate of transistor M4. Node F" is connected to one input of voltage amplifier 401, while its other input is connected to node D, with the output of voltage amplifier 401 being connected to the gate of transistor M8. A resistor R4 is connected between common connection node of current sink 12 and the source of transistor M4 and the common connection node of current source 11 and the drain of transistor M8. A capacitor C1 is connected between node B' and node F". The gate of transistor M6 is connected to node F". Capacitor C1 uses the Miller effect to compensate and stabilize amplifier 402.

In operation, the differential amplifier 402 forces node B' to be equal to Vref. This automatically ensures that the current entering node B' from current source Iref leaves through the drain of transistor M6, so that the drain current of transistor M6 is equal to Iref. In addition, by drawing current Ix through transistor M8, the loop including voltage amplifier 401 and transistor M8 forces the voltage at node D to equal the gate voltage of transistor M6, identified as voltage Vx in the figure. Thus, by mirroring the current Ix to the transconductor circuit, the required floating bias voltage can be established and hence the common-mode voltage of the transconductor circuit stabilized, while maintaining overall stability of the transconductor circuit. It will be understood that like circuitry will be present in the other side of the differential transconductor circuit (except for differential amplifier 402, since node F" is common to both sides), and that both sets of circuit act in concert to provide such differential function. Here again, as in FIG. 3, the same voltage, i.e., at node B' (and its counterpart for the other output node of the circuit), is used to set the D.C. reference of the output nodes of the circuit as well as to provide feedback for signals at the output, although in a configuration that is more stable than that of the circuit of FIG. 3.

Although the present invention and its advantages have been described in detail, it should be understood that various changes, substitutions and alterations can be made herein without departing from the spirit and scope of the invention as defined by the appended claims.

What is claimed is:

1. A transconductor circuit, comprising:
    a differential transconductor amplifier circuit, including an input pair of transistors adapted to receive a differential input voltage, and including a pair of output nodes adapted to provide a differential output current;
    a second pair of transistors providing current to the input pair of transistors; and
    a floating voltage circuit adapted to generate a floating voltage corresponding to a common-mode voltage of the differential output nodes and to control the second pair of transistors in response to the floating voltage to stabilize the common-mode voltage of the differential transconductor amplifier circuit.

2. A transconductor circuit as in claim 1, wherein the second pair of transistors comprises a first MOS transistor and a second MOS transistor connected by a source and drain thereof between the input pair of transistors, respectively, and a reference ground, and the second pair of transistors is connected together at an internal node by a respective gate of each, and wherein the floating voltage circuit comprises:
    a third MOS transistor connected in series with a first current source between a voltage source and the reference ground, and having a gate connected to a first one of the pair of output nodes;
    a fourth MOS transistor connected in series with a second current source between the voltage source and the reference ground, and having a gate connected to a second one of the pair of output nodes;
    a first voltage source connected in series with a first resistor between the common connection node of the third MOS transistor and the first current source and the internal node; and
    a second voltage source connected in series with a second resistor between the common connection node of the fourth MOS transistor and the second current source and the internal node.

3. A transconductor circuit as in claim 1, wherein the second pair of transistors comprises a first MOS transistor and a second MOS transistor connected by a source and drain thereof between the input pair of transistors, respectively, and a reference ground, and the second pair of transistors is connected together at an internal node by a respective gate of each, and wherein the floating voltage circuit comprises:
    a third MOS transistor connected in series with a first current source between a voltage source and the reference ground, and having a gate connected to a first one of the pair of output nodes;
    a fourth MOS transistor connected in series with a second current source between the voltage source and the reference ground, and having a gate connected to a second one of the pair of output nodes;
    a third current source connected in series with the voltage source and the internal node;
    a first resistor connected between the common connection node of the third MOS transistor and the first current source and the internal node;
    a second resistor connected between the common connection node of the fourth MOS transistor and the second current source and the internal node;
    a fifth MOS transistor connected by a source and drain thereof between the internal node and the reference ground;
    a first amplifier having a first input connected to a reference voltage and having a second input connected to the first one of the pair of output nodes; and
    a second amplifier having a first input connected to the reference voltage and having a second input connected to the second one of the pair of output nodes.

4. A transconductor circuit as in claim 1, wherein the second pair of transistors comprises a first MOS transistor and a second MOS transistor connected by a source and drain thereof between the input pair of transistors, respectively, and a reference ground, and the second pair of transistors is connected together at an internal node by a respective gate of each, and wherein the floating voltage circuit comprises:
    a third MOS transistor connected in series with a first current source between a voltage source and the reference ground, and having a gate connected to a first one of the pair of output nodes;
    a fourth MOS transistor connected in series with a second current source between the voltage source and the reference ground, and having a gate connected to a second one of the pair of output nodes;
    a first differential amplifier having a first input for receiving a reference voltage and having a second input connected to the first one of the pair of output nodes, and having an internal node common with the internal node of the transconductor circuit;
    a first capacitor connected between the internal node and the first one of the pair of output nodes;
    a fifth MOS transistor connected in series with a third current source between the voltage source and the reference ground, and having a gate;
    a second differential amplifier having a first input connected to the first internal node and having a second input connected to the common connection node of the fifth MOS transistor and the third current source, and having an output connected to the gate of the fifth MOS transistor;
    a first resistor connected between the second input of the second differential amplifier and the common connection node of the third MOS transistor and the first current source;
    a second capacitor connected between the internal node and the second one of the pair of output nodes;
    a sixth MOS transistor connected in series with a fourth current source between the voltage source and the reference ground, and having a gate;

a third differential amplifier having a first input connected to the internal node and having a second input connected to the common connection node of the sixth MOS transistor and the fourth current source, and having an output connected to the gate of the sixth MOS transistor; and a second resistor connected between the second input of the third differential amplifier and the common connection node of the fourth MOS transistor and the second current source.

5. A transconductor circuit as in claim 4, wherein:

the second differential amplifier comprises a seventh and an eighth MOS transistor connected together as a first current mirror, the seventh MOS transistor being the mirroring transistor, the eighth MOS transistor being the mirrored transistor, a ninth MOS transistor connected by its source and drain in series with the eighth MOS transistor between the voltage supply and the reference ground, and having a gate connected to the first one of the pair of output nodes, and a tenth MOS transistor connected by its source and drain in series with the seventh MOS transistor, the common connection node thereof being the internal node, and having a gate for connection to the reference voltage; and the third differential amplifier comprises an eleventh and a twelfth MOS transistor connected together as a second current mirror, the eleventh MOS transistor being the mirroring transistor, the twelfth MOS transistor being the mirrored transistor, a thirteenth MOS transistor connected by its source and drain in series with the twelfth MOS transistor between the voltage supply and the reference ground, and having a gate connected to the second one of the pair of output nodes, and a fourteenth MOS transistor connected by its source and drain in series with the eleventh MOS transistor, the common connection node thereof being the internal node, and having a gate for connection to the reference voltage.

\* \* \* \* \*